United States Patent
Kim et al.

(10) Patent No.: US 10,522,354 B2
(45) Date of Patent: Dec. 31, 2019

(54) ANTIMONY CO-DOPING WITH PHOSPHORUS TO FORM ULTRASHALLOW JUNCTIONS USING ATOMIC LAYER DEPOSITION AND ANNEALING

(71) Applicant: Lam Research Corporation, Fremont, CA (US)

(72) Inventors: Yunsang S. Kim, Monte Sereno, CA (US); Edmund Burte, Neudrossenfeld (DE); Bodo Kalkofen, OT Bittkau (DE)

(73) Assignee: LAM RESEARCH CORPORATION, Fremont, CA (US)

( * ) Notice: Subject to any disclaimer, the term of this patent is extended or adjusted under 35 U.S.C. 154(b) by 14 days.

(21) Appl. No.: 15/963,270

(22) Filed: Apr. 26, 2018

(65) Prior Publication Data

US 2018/0358228 A1   Dec. 13, 2018

Related U.S. Application Data

(60) Provisional application No. 62/516,933, filed on Jun. 8, 2017.

(51) Int. Cl.
*H01L 21/22* (2006.01)
*H01L 21/225* (2006.01)
*H01L 21/311* (2006.01)
*H01L 21/324* (2006.01)
*H01L 21/02* (2006.01)

(52) U.S. Cl.
CPC ...... *H01L 21/2255* (2013.01); *H01L 21/0228* (2013.01); *H01L 21/31111* (2013.01); *H01L 21/324* (2013.01)

(58) Field of Classification Search
CPC ..................................................... H01L 1/2255
USPC ............................................................ 438/558
See application file for complete search history.

(56) References Cited

U.S. PATENT DOCUMENTS

| | | | | |
|---|---|---|---|---|
| 3,920,882 A | * | 11/1975 | Venkatu | C30B 31/165 428/701 |
| 3,923,563 A | * | 12/1975 | Venkatu | C30B 31/165 438/567 |
| 7,807,556 B2 | * | 10/2010 | Dunne | H01L 21/2258 257/E21.468 |
| 9,692,209 B2 | * | 6/2017 | Bessette | H01L 21/0237 |

(Continued)

OTHER PUBLICATIONS

Bodo Kalkofen et al.; "Thin Film Dopant Sources Grown by PALD for Shallow Semiconductor Doping"; Apr. 5, 2018; 2 pages.

(Continued)

*Primary Examiner* — Caleb E Henry

(57) ABSTRACT

A method for processing a substrate includes providing a substrate with a layer including a material selected from a group consisting of silicon (Si), germanium (Ge) and silicon germanium. The method includes depositing a first layer on the layer of the substrate using atomic layer deposition (ALD). The method includes depositing a second layer on the first layer using ALD. Depositing one of the first layer and the second layer includes depositing phosphorus oxide and depositing the other one of the first layer and the second layer includes depositing antimony oxide. The method includes annealing the substrate to drive antimony and phosphorus from the first layer and the second layer into the layer of the substrate to create a junction.

21 Claims, 4 Drawing Sheets

(56) References Cited

U.S. PATENT DOCUMENTS

| | | | |
|---|---|---|---|
| 2007/0212861 A1* | 9/2007 | Chidambarrao | H01L 21/26506 438/530 |
| 2007/0222020 A1* | 9/2007 | Cheng | H01L 27/1087 257/499 |
| 2013/0240902 A1* | 9/2013 | Schulze | H01L 29/66712 257/77 |

OTHER PUBLICATIONS

Bodo Kalkofen et al.; "Investigation of Oxide Thin Films Deposited by Atomic Layer Deposition as Dopant Source for Ultra-Shallow Doping of Silicon"; Microelectronic Engineering 109 (2013); Mar. 26, 2013; pp. 113-116.

Bodo Kalkofen et al.; "Use of B2O3 Films Grown by Plasma-Assisted Atomic Layer Deposition for Shallow Boron Doping in Silicon"; Journal of Vacuum Science & Technology A, vol. 33, No. 3; Apr. 15, 2015; 12 pages.

Bodo Kalkofen et al.; "Investigation of Antimony Oxide Films Deposited by Atomic Layer Deposition"; ECS Transactions, 45 (3); The Electrochemical Society; 2012; pp. 461-473.

Bodo Kalkofen et al.; "Application of Atomic Layer Deposited Dopant Sources for Ultra-Shallow Doping of Silicon"; Physica Status Solidi C, 11, No. 1; Dec. 5, 2013; pp. 41-45.

* cited by examiner

ANTIMONY CO-DOPING WITH PHOSPHORUS TO FORM ULTRASHALLOW JUNCTIONS USING ATOMIC LAYER DEPOSITION AND ANNEALING

CROSS-REFERENCE TO RELATED APPLICATIONS

This application claims the benefit of U.S. Provisional Application No. 62/516,933, filed on Jun. 8, 2017. The entire disclosure of the application referenced above is incorporated herein by reference.

FIELD

The present disclosure relates to substrate processing systems and methods, and more particularly to systems and methods for antimony co-doping with phosphorus to form ultrashallow junctions using atomic layer deposition and annealing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit, etch or otherwise treat film on substrates such as semiconductor wafers. During processing, it is sometimes necessary to dope a layer of the substrate using one or more dopants. Dopants may be used to create n-type or p-type regions of active devices such as transistors. For example, phosphorus (P) or antimony (Sb) may be used to create n-type regions in materials such as silicon (Si), germanium (Ge) or silicon germanium ($Si_{1-x}Ge_x$) where x is a real number between 0 and 1. Processes for doping Si, Ge or $Si_{1-x}Ge_x$ include ion implantation processing ($I^2P$) or plasma doping. Ion implantation of Sb and P requires two distinct implant steps and expensive equipment.

SUMMARY

A method for processing a substrate includes providing a substrate with a layer including a material selected from a group consisting of silicon (Si), germanium (Ge) and silicon germanium ($Si_{1-x}Ge_x$). The method includes depositing a first layer on the layer of the substrate using atomic layer deposition (ALD). The method includes depositing a second layer on the first layer using ALD. Depositing one of the first layer and the second layer includes depositing phosphorus oxide and depositing the other one of the first layer and the second layer includes depositing antimony oxide. The method includes annealing the substrate to drive antimony and phosphorus from the first layer and the second layer into the layer of the substrate to create a junction.

In other features, depositing the one of the first layer and the second layer includes performing a plurality of ALD supercycles. Each of the plurality of ALD supercycles includes depositing N phosphorus oxide layers and M silicon oxide layers, where M and N are integers greater than zero.

In other features, depositing the first layer includes performing the plurality of ALD supercycles and depositing the second layer includes depositing antimony oxide. The junction is an ultrashallow junction. The ultrashallow junction has a depth in a range from 4 nm to 10 nm after annealing.

In other features, the first layer has a thickness in a range from 2 nm to 10 nm. The second layer has a thickness in a range from 2 nm to 10 nm. N is in a range from 3 to 7 and M is in a range from 1 to 3. The plurality of ALD supercycles is in a range from 20 to 60. The plurality of ALD supercycles is in a range from 35 to 45. The antimony oxide is deposited during T ALD cycles and T is in a range from 80 to 100.

In other features, the method includes etching the first and second layers.

In other features, the substrate includes trenches having an aspect ratio that is greater than 4:1. The layer of the substrate includes germanium. Doping levels in the ultrashallow junction are greater than or equal to $1E20$ atoms/$cm^3$ at a surface of the layer of the substrate and greater than or equal to $1E17$ atoms/$cm^3$ below the surface of the layer of the substrate.

A method for processing a substrate includes providing a substrate with a layer including a material selected from a group consisting of silicon (Si), germanium (Ge) and silicon germanium ($Si_{1-x}Ge_x$). The method includes depositing a first layer on the layer of the substrate using atomic layer deposition (ALD). The first layer includes phosphorus, antimony, and oxygen. The method includes annealing the substrate to drive the antimony and the phosphorus from the first layer into the layer of the substrate to create a junction.

In other features, depositing the first layer includes depositing one or more ALD monolayers of phosphorus, one or more ALD monolayers of antimony and one or more ALD monolayers of oxide. The junction is an ultrashallow junction. The ultrashallow junction has a depth in a range from 4 nm to 10 nm after annealing.

In other features, the method includes etching the first layers. The substrate includes trenches having an aspect ratio that is greater than 4:1.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure are used to co-dope an underlying layer such as silicon (Si), germanium (Ge) or silicon germanium ($Si_{1-x}Ge_x$) with phosphorus (P) and antimony (Sb). A first layer includes antimony oxide ($Sb_{x1}O_{y1}$) (where x1 and y1 are integers) and a second layer includes phosphorus oxide ($P_{x2}O_{y2}$) (where x2 and y2 are integers). Alternately, the first layer includes phosphorus, antimony and oxygen. The antimony enhances the concentration of phosphorus that diffuses into the underlying layer. The first and second layers are deposited on the underlying layer using atomic layer deposition (ALD). After depositing the layers, annealing is performed. The P/Sb is driven into the underlying layer to form an ultrashallow junction. Afterwards, the first and second layers can be removed by etching and further processing of the substrate may be performed.

Figure 1A:
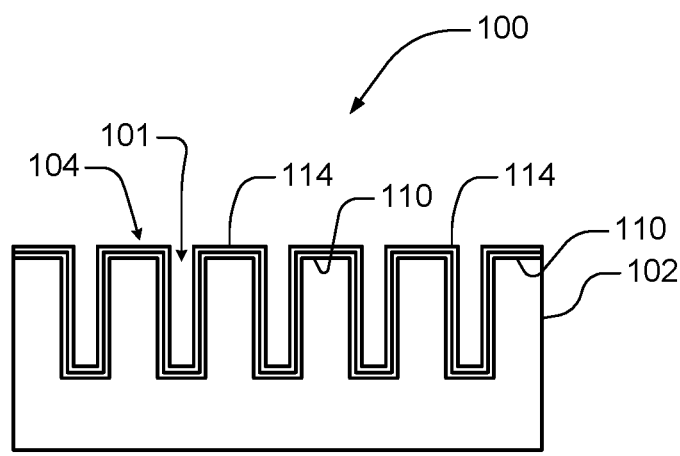
FIGS. 1A-1C are side cross-sectional views of an example of a substrate including a first layer including phosphorus (P) and a second layer including antimony (Sb) that is deposited using atomic layer deposition (ALD) onto an underlying layer including Si, Ge or $Si_{1-x}Ge_x$ according to the present disclosure.
Figure 1B:
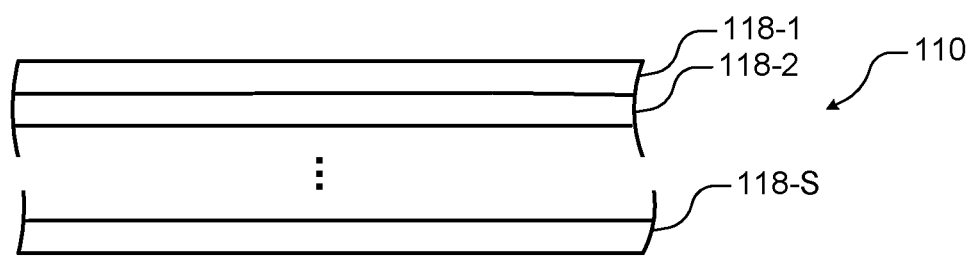
Figure 1C:
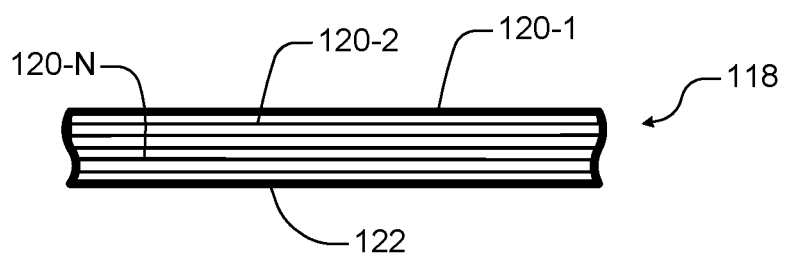

Referring now to FIGS. 1A-1C, an example of a substrate 100 is shown. In some examples, the substrate 100 includes features 101 such as trenches. In FIG. 1A, the substrate 100 includes an underlying layer 102 and a bi-layer 104. In some examples, the bi-layer 104 includes a first layer 110 including phosphorus oxide and a second layer 114 including antimony oxide. The first and second layers 110, 114 are deposited on the underlying layer 102 using atomic layer deposition (ALD). The underlying layer 102 includes a material such as silicon (Si), germanium (Ge) or silicon germanium ($Si_{1-x}Ge_x$).

In some examples, a thickness of the first layer 110 is in a range from 2 nm to 10 nm, although other thicknesses can be used. In some examples, a thickness of the second layer 114 is in a range from 2 nm to 10 nm, although other thicknesses can be used.

In FIGS. 1B-1C, the first layer 110 includes a plurality of ALD supercycle layers 118-1, 118-2, ... and 118-S (collectively supercycle layers 118). In FIG. 1C, each ALD supercycle layer 118 includes ALD deposition of N ALD layers of $P_{x2}O_{y2}$ (shown as N ALD $P_{x2}O_{y2}$ layers 120-1, 120-2, ... 120-N) and M layers of silicon oxide ($Si_{x3}O_{y3}$) (where x3 and y3 are integers) (collectively shown as 122), where N and M are integers greater than zero.

In some examples, N is in a range from 3-7 and M is in a range from 1-3, although other values can be used. In some examples, 20 to 60 ALD supercycles are used, although additional or fewer ALD supercycles can be used. In some examples, 35 to 45 ALD supercycles are used, although additional or fewer ALD supercycles can be used. In some examples, 40 ALD supercycles are used and each ALD supercycle includes 5 cycles of $P_{x2}O_{y2}$ and 1 cycle of $Si_{x3}O_{y3}$. In some examples, the second layer 114 is deposited using T ALD cycles, where T is an integer in a range from 80 to 120. In some examples, T=100.

In other examples, the first layer 110 includes antimony oxide ($Sb_{x1}O_{y1}$) and the second layer 114 includes phosphorus oxide ($P_{x2}O_{y2}$). In this example, a cap layer may be used to prevent degradation of the phosphorus oxide. In some examples, the cap layer includes oxide such as silicon oxide.

In some examples, the second layer 114 includes the plurality of ALD supercycle layers (each ALD supercycle layer including ALD deposition of N ALD layers of $P_{x2}O_{y2}$ and M layers of silicon oxide ($Si_{x3}O_{y3}$) as described above). In still other examples, ALD monolayers of the phosphorus oxide ($P_{x2}O_{y2}$), antimony oxide ($Sb_{x1}O_{y1}$) and silicon oxide ($Si_{x3}O_{y3}$) are varied in other ways. For example, the ALD monolayers are deposited in a pattern of one or more adjacent ALD monolayer layers of each material. The pattern may be repeated in a specific pattern, varied in a specific manner or randomized.

Figure 2:
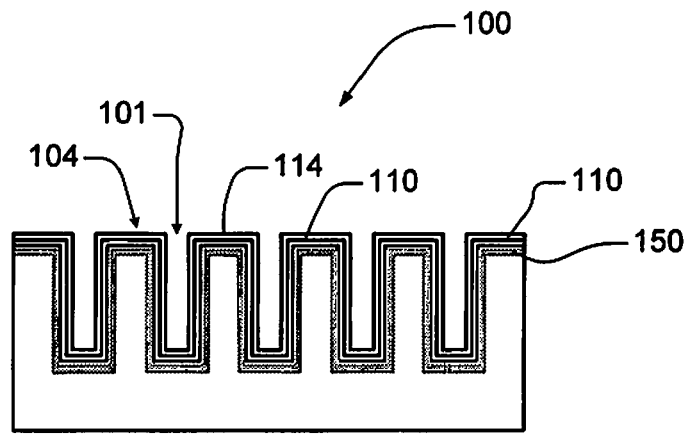
FIG. 2 is a side cross-sectional view of the substrate of FIGS. 1A-1C after annealing is performed to drive the P/Sb into the underlying layer to form an ultrashallow junction.

Referring now to FIG. 2, the substrate 100 is shown after annealing to drive P/Sb into the underlying layer 102 and to form an ultrashallow junction. The P/Sb dopants are driven into the underlying layer 102 as shown at 150. In some examples, the annealing includes flash lamp annealing, thermal annealing or rapid thermal processing (RTP). In some examples, the RTP is performed at a temperature that is greater than 800° C. In some examples, the first and second layers 110 and 114 are removed and additional processing is performed. For example, the first and second layers 110 and 114 can be removed by etching.

Figure 3:
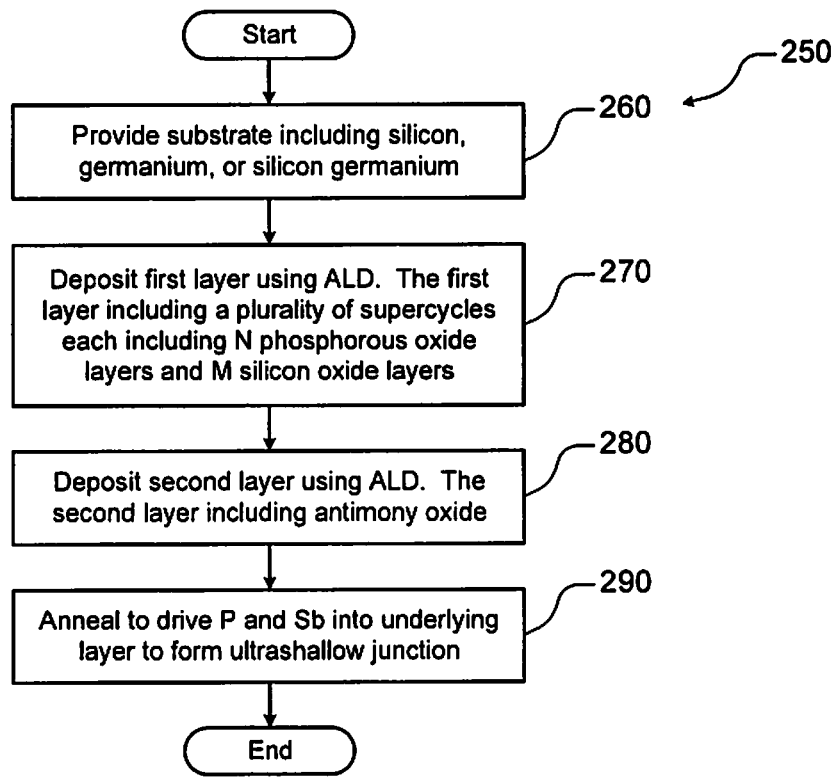
FIG. 3 is a flowchart of an example of a method for P/Sb co-doping of an underlying layer including Si, Ge or $Si_{1-x}Ge_x$ using atomic layer deposition and annealing according to the present disclosure.

Referring now to FIG. 3, a method 250 for co-doping an underlying layer including Si, Ge or $Si_{1-x}Ge_x$ with P/Sb is shown. At 260, a substrate is provided that includes an underlying layer. The underlying layer includes Si, Ge or $Si_{1-x}Ge_x$. At 270, a first layer is deposited on the underlying layer using atomic layer deposition (ALD). The first layer includes $P_{x2}O_{y2}$. In some examples, the first layer is deposited using a plurality of ALD supercycles. Each of the ALD supercycles includes deposition of M $P_{x2}O_{y2}$ monolayers and N $Si_{x3}O_{y3}$ monolayers.

At 280, a second layer is deposited on the first layer. The second layer is deposited on the first layer using ALD. The second layer includes antimony oxide such as $Sb_{x1}O_{y1}$. At 290, the substrate is annealed to drive the P and Sb into the underlying layer to form an ultrashallow junction.

Figure 4:
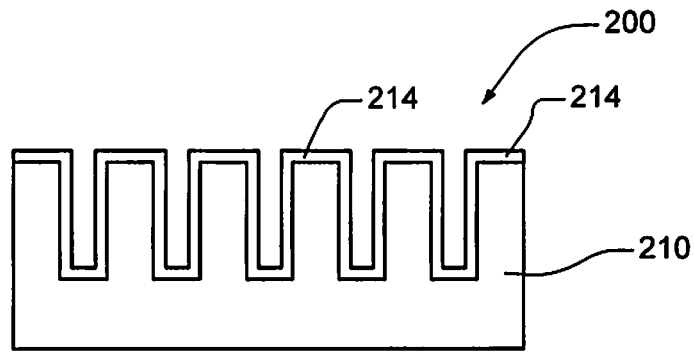
FIG. 4 is a side cross-sectional view of an example of a substrate including a $P_dSb_eO_f$ layer (where d, e and f are integers) that is deposited using ALD onto an underlying layer including Si, Ge or $Si_{1-x}Ge_x$ according to the present disclosure.
Figure 5:
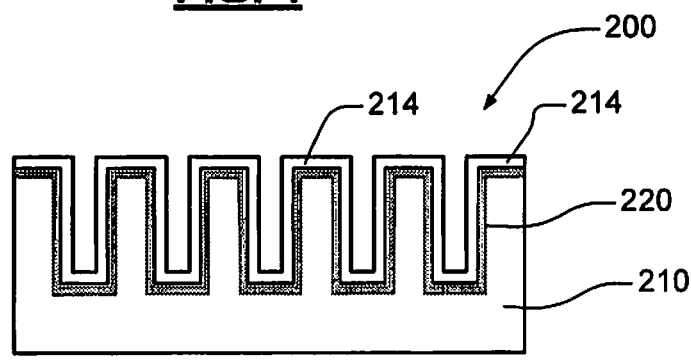
FIG. 5 is a side cross-sectional view of the substrate of FIG. 4 after annealing.

Referring now to FIG. 4-5, an example of a substrate 200 is shown. In FIG. 4, the substrate includes an underlying layer 210 made of a material selected from a group consisting of Si, Ge or $Si_{1-x}Ge_x$. A first layer 214 is made of a material that is deposited using ALD and that includes phosphorus antimony oxide ($P_dSb_eO_f$, where d, e and f are integers). In FIG. 5, the substrate 200 is shown after annealing. The P/Sb dopants are driven into the underlying layer 210 as shown at 220. The P/Sb doping forms an ultrashallow junction. In some examples, the first layer 214 is removed and further processing is performed. In some examples, the first layer 214 is removed by etching.

Figure 6:
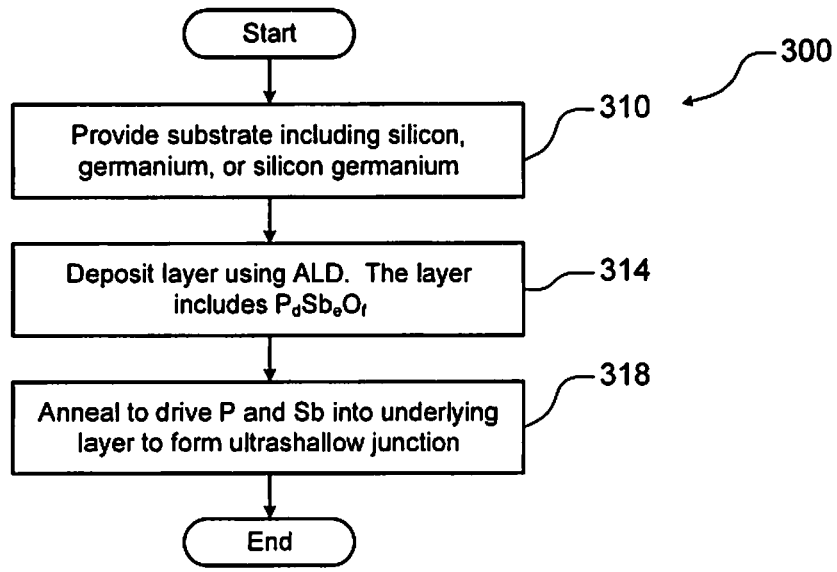
FIG. 6 is a flowchart of another example of a method for P/Sb co-doping an underlying layer including Si, Ge or $Si_{1-x}Ge_x$ using ALD and annealing according to the present disclosure.

Referring now to FIG. 6, a method 300 for co-doping an underlying layer including Si, Ge or $Si_{1-x}Ge_x$ with phosphorus (P) and antimony (Sb) is shown. At 310, a substrate is provided that includes an underlying layer. The underlying layer includes Si, Ge or $Si_{1-x}Ge_x$. At 314, a first layer is deposited on the underlying layer using atomic layer deposition (ALD). The first layer includes PdSbeOf, where d, e and f are integers. At 318, annealing is performed to drive the P and Sb into the underlying layer to define an ultrashallow junction in the underlying layer. In some examples, the phosphorus antimony oxide layer may include individual ALD monolayers of phosphorus, antimony and oxide that are repeated in a specific pattern, varied or randomized.

In some examples, the phosphorus oxide, antimony oxide, silicon oxide, and/or phosphorus antimony oxide are deposited in a plasma-enhanced (PE) ALD substrate processing system. In some examples, the PEALD system uses inductively coupled plasma (ICP) or capacitively coupled plasma (CCP). In some examples, the plasma gas mixture may include triethylantimony (TESb orSbEt$_3$) for antimony oxide, although other precursors can be used. In some examples, the plasma gas mixture may include triethylphosphite (TEPO) (P(OEt)$_3$) for phosphorus oxide, although other precursors can be used.

In some examples, the substrate includes features such as trenches. In some examples, the trenches have an aspect ratio greater than 4:1. In some examples, the trenches have an aspect ratio in a range from 4-20. In some examples, the trenches have an aspect ratio of ~6:1. In some examples, the ultrashallow junction has a depth in a range from 4 nm to 10 nm after annealing. In some examples, the ultrashallow junction has a depth of ~6 nm after annealing for 5 seconds of RTP at 950° C. In some examples, doping levels in the ultrashallow junction is greater than or equal to 1E20 atoms/cm$^3$ in Ge at the surface and greater than or equal to 1E17 atoms/cm$^3$ below the surface.

In some examples, concentration profiles of the P and the Sb in the ultrashallow junction are controlled by controlling concentrations of P and Sb in the layers and the relative thicknesses of the layers. In other examples, the concentration profiles of the P and the Sb in the ultrashallow junction are controlled by a time-temperature profile of the drive-in anneal.

In some examples, the underlying layer includes Ge or $Si_{1-x}Ge_x$ having a relatively high concentration of Ge. In some examples, the high concentration of Ge in $Si_{1-x}Ge_x$ comprises greater than 50%. weight of Ge in $Si_{1-x}Ge_x$. In some examples, the high concentration of Ge in $Si_{1-x}Ge_x$ comprises greater than 75%. weight of Ge in $Si_{1-x}Ge_x$.

Figure 7:
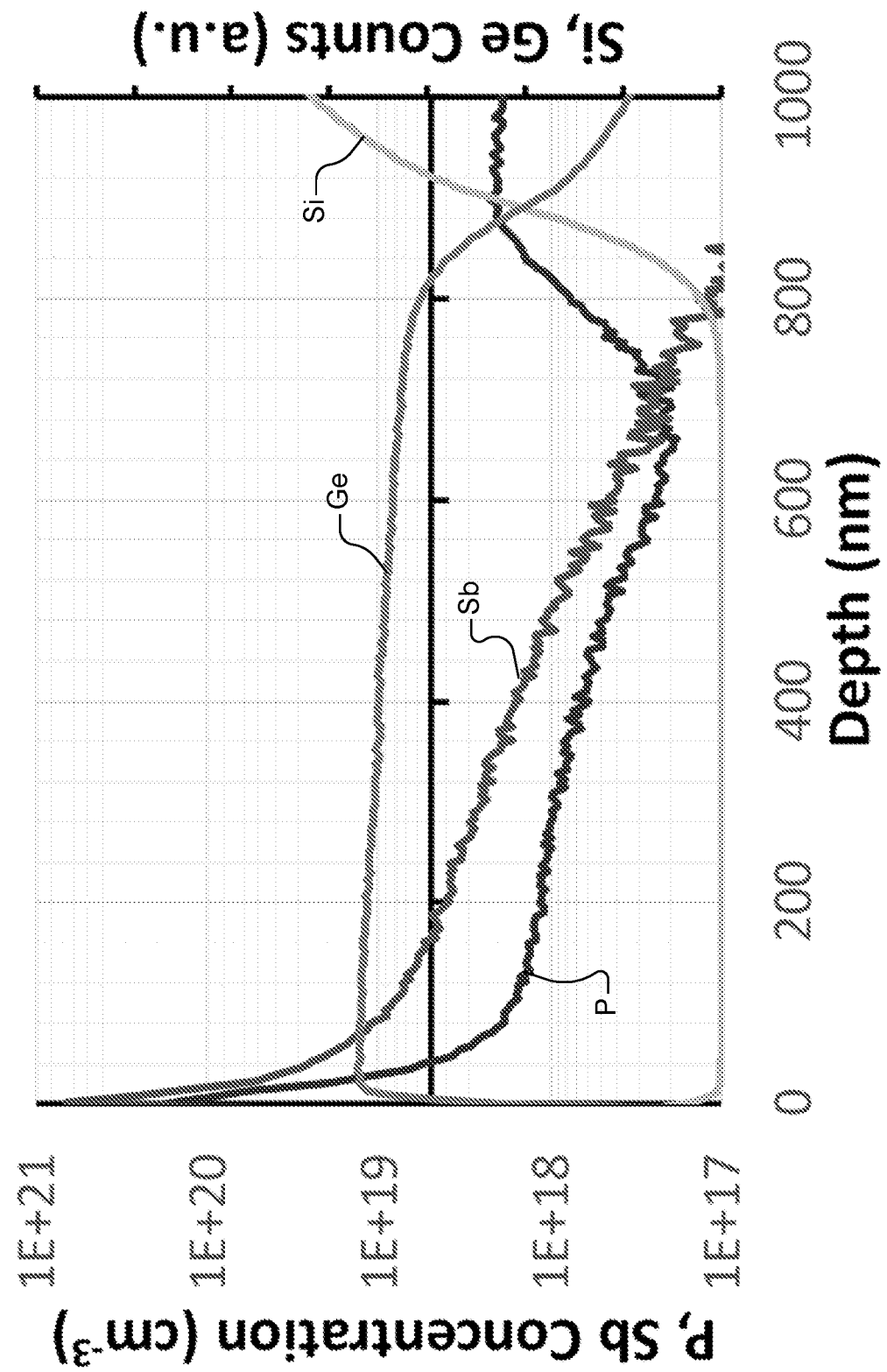
FIG. 7 is a graph illustrating phosphorus and antimony concentration in an underlying layer as a function of depth.

Referring now to FIG. 7, an example of phosphorus and antimony concentration is shown as a function of depth. The substrate includes a germanium layer arranged on a silicon layer. The phosphorus and antimony have a relatively controlled decreasing concentration as a function of depth as compared to bell-shaped doping profiles that are produced by other methods such as I$^2$P.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for processing a substrate, comprising:
   providing a substrate with a layer including a material selected from a group consisting of silicon (Si), germanium (Ge) and silicon germanium ($Si_{1-x}Ge_x$);
   depositing a first layer on the layer of the substrate using atomic layer deposition (ALD);
   depositing a second layer on the first layer using ALD, wherein depositing one of the first layer and the second layer includes depositing phosphorus oxide and depositing the other one of the first layer and the second layer includes depositing antimony oxide; and
   annealing the substrate, one of sequentially after depositing the second layer and sequentially after depositing a cap layer on the second layer, to drive antimony and phosphorus from the first layer and the second layer into the layer of the substrate to create a junction.

2. The method of claim 1, wherein depositing the one of the first layer and the second layer includes performing a plurality of ALD supercycles, and wherein each of the plurality of ALD supercycles includes depositing N phosphorus oxide layers and M silicon oxide layers, where M and N are integers greater than zero.

3. The method of claim 2, wherein depositing the first layer includes performing the plurality of ALD supercycles and depositing the second layer includes depositing antimony oxide.

4. The method of claim 2, wherein depositing the second layer includes performing the plurality of ALD supercycles and depositing the first layer includes depositing antimony oxide.

5. The method of claim 1, wherein the junction is an ultrashallow junction.

6. The method of claim 5, wherein the ultrashallow junction has a depth in a range from 4 nm to 10 nm after annealing.

7. The method of claim 1, wherein:
   the first layer has a thickness in a range from 2 nm to 10 nm; and
   the second layer has a thickness in a range from 2 nm to 10 nm.

8. The method of claim 2, wherein N is in a range from 3 to 7 and M is in a range from 1 to 3.

9. The method of claim 2, wherein the plurality of ALD supercycles is in a range from 20 to 60.

10. The method of claim 2, wherein the plurality of ALD supercycles is in a range from 35 to 45.

11. The method of claim 1, wherein the antimony oxide is deposited during T ALD cycles and wherein T is in a range from 80 to 100.

12. The method of claim 1, further comprising etching the first and second layers.

13. The method of claim 5, wherein the substrate includes trenches having an aspect ratio that is greater than 4:1.

14. A method for processing a substrate, comprising:
providing a substrate with a layer including a material selected from a group consisting of silicon (Si), germanium (Ge) and silicon germanium ($Si_{1-x}Ge_x$);
depositing a first layer on the layer of the substrate using atomic layer deposition (ALD);
depositing a second layer on the first layer using ALD, wherein depositing one of the first layer and the second layer includes depositing phosphorus oxide and depositing the other one of the first layer and the second layer includes depositing antimony oxide; and
annealing the substrate to drive antimony and phosphorus from the first layer and the second layer into the layer of the substrate to create a junction,
wherein the layer of the substrate includes germanium and wherein doping levels in the ultrashallow junction are greater than or equal to $1E^{20}$ atoms/cm$^3$ at a surface of the layer of the substrate and greater than or equal to $1E^{17}$ atoms/cm$^3$ below the surface of the layer of the substrate.

15. A method for processing a substrate, comprising:
providing a substrate with a layer including a material selected from a group consisting of silicon (Si), germanium (Ge) and silicon germanium ($Si_{1-x}Ge_x$);
depositing a first layer on the layer of the substrate using atomic layer deposition (ALD), wherein the first layer includes phosphorus, antimony, and oxygen; and
annealing the substrate, sequentially after depositing the first layer, to drive the antimony and the phosphorus from the first layer into the layer of the substrate to create a junction.

16. The method of claim 15, wherein depositing the first layer includes depositing one or more ALD monolayers of phosphorus, one or more ALD monolayers of antimony and one or more ALD monolayers of oxide.

17. The method of claim 15, wherein the junction is an ultrashallow junction.

18. The method of claim 17, wherein the ultrashallow junction has a depth in a range from 4 nm to 10 nm after annealing.

19. The method of claim 15, further comprising etching the first layers.

20. The method of claim 15, wherein the substrate includes trenches having an aspect ratio that is greater than 4:1.

21. The method of claim 15, wherein the layer of the substrate includes germanium and wherein doping levels in the ultrashallow junction are greater than or equal to $1E^{20}$ atoms/cm$^3$ at a surface of the layer of the substrate and greater than or equal to $1E^{17}$ atoms/cm$^3$ below the surface of the layer of the substrate.

* * * * *